United States Patent [19]

Haines et al.

[11] Patent Number: 5,232,570
[45] Date of Patent: Aug. 3, 1993

[54] NITROGEN-CONTAINING MATERIALS FOR WEAR PROTECTION AND FRICTION REDUCTION

[75] Inventors: William G. Haines; Chongwon Byun; Earl Johns; Quock Ng, all of Colorado Springs, Colo.; Durga Ravipati, Phoenix, Ariz.; Robert M. Raymond; Gary C. Rauch, both of Colorado Springs, Colo.

[73] Assignee: Digital Equipment Corporation, Maynard, Mass.

[21] Appl. No.: 723,431

[22] Filed: Jun. 28, 1991

[51] Int. Cl.$^5$ .............................................. C23C 14/35
[52] U.S. Cl. ............................. 204/192.16; 204/192.2
[58] Field of Search ........... 204/192.1, 192.15, 192.16, 204/192.2

[56] References Cited

U.S. PATENT DOCUMENTS

| | | | |
|---|---|---|---|
| 3,057,808 | 10/1962 | Fierce et al. | 260/1 |
| 3,961,103 | 6/1976 | Aisenberg | 427/39 |
| 4,429,024 | 1/1984 | Ueno et al. | 428/694 |
| 4,693,927 | 9/1987 | Nishikawa et al. | 428/216 |
| 4,783,368 | 11/1988 | Yamamoto et al. | 428/408 |
| 4,840,844 | 6/1989 | Futamoto et al. | 428/336 |
| 4,880,687 | 11/1989 | Yokoyama et al. | 428/141 |
| 5,084,319 | 1/1992 | Hibst et al. | 428/64 |
| 5,110,679 | 5/1992 | Haller et al. | 428/408 |

FOREIGN PATENT DOCUMENTS 0231894 8/1987 European Pat. Off. .
0244874 11/1987 European Pat. Off. .

OTHER PUBLICATIONS

Torng et al., *J. Mater. Res.;* 5:2490–2496; Nov. (1990).
Torng et al., *Journal of the Magnetics Society of Japan;* 13:169-174; (1989).
Torng et al., "Enhancement of Diamond SP$^3$ Bonding in RF Sputtered Carbon Films with Nitrogen Added".
Cuomo et al., *J. Vac. Sci. Technol.;* 16:299-302 Mar.-/Apr. (1979).
Cuomo, et al., "Preparation of Paracyanogen-Like Films" *IBM Tech. Disc. Bull.* vol. 19, No. 2, Jul. 1976, p. 742.
Memming, et al., "Properties of Polymeric Layers of Hydrogenated, etc", *Thin Solid Films* 143 (1986) 31-41.

*Primary Examiner*—Aaron Weisstuch
*Attorney, Agent, or Firm*—Fish & Richardson

[57] ABSTRACT

A hard protective material and method for forming the medium having the formula $C_xN_y$. The medium may be formed as a protective film on a magnetic recording disk in a sputtering apparatus such as a magnetron apparatus. The amount of nitrogen in the film may be affected by controlling the collisions of the sputtered material between the target and deposition substrate by controlling the bombardment of the substrate by electrons. The films exhibit properties indicative of a textured morphology on a nanoscale which enhances the retention of lubricant overcoats.

22 Claims, 5 Drawing Sheets

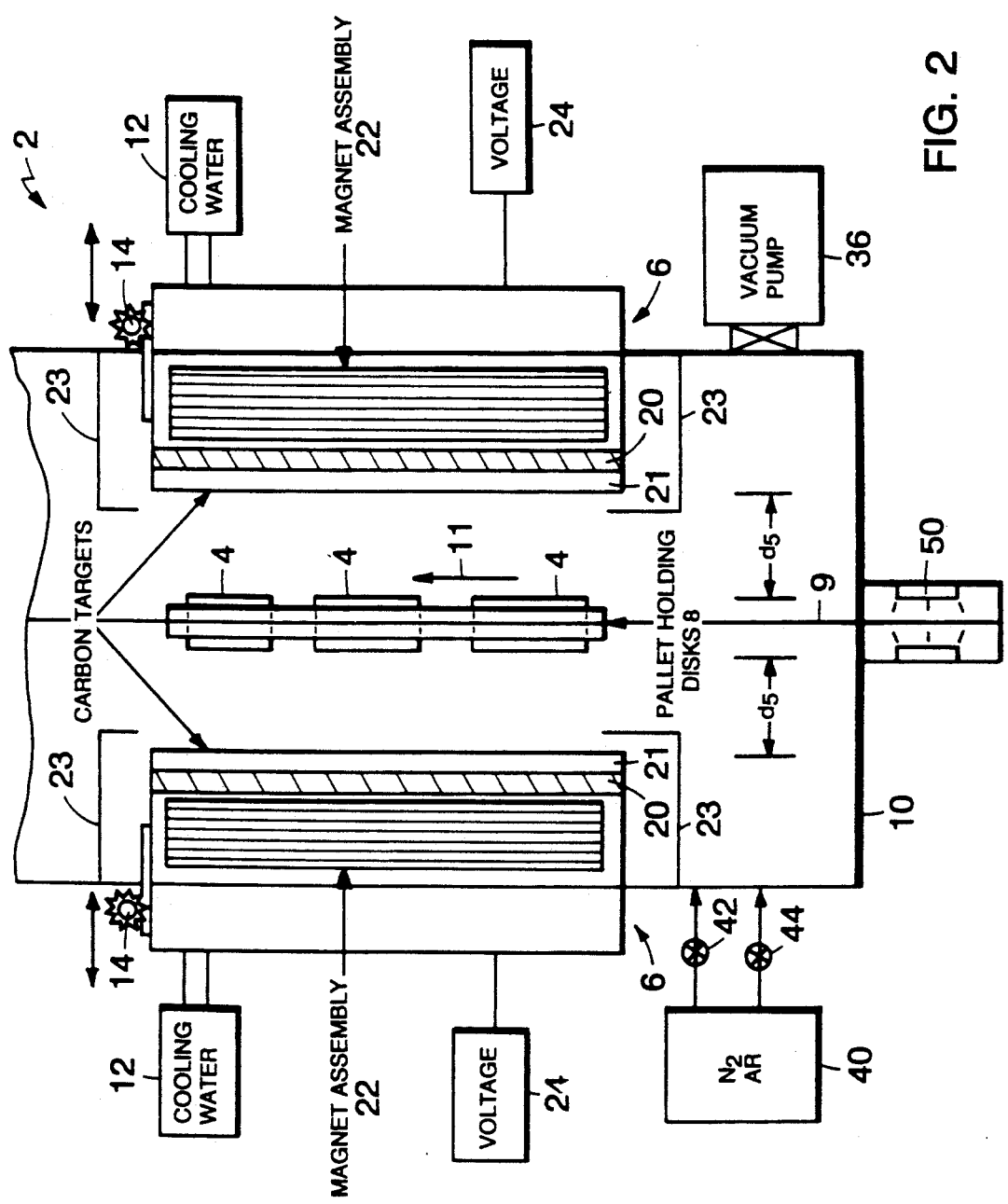

NITROGEN-CONTAINING MATERIALS FOR WEAR PROTECTION AND FRICTION REDUCTION

FIELD OF THE INVENTION

This invention relates to wear resistant, friction reducing materials, such as may be used as thin coatings on magnetic disks.

BACKGROUND OF THE INVENTION

To reduce the wear of magnetic recording media caused, e.g., by contact of the recording head flying at low heights (microinch range) above the media, a thin, sputter deposited carbon film is typically applied to the top of the media. Problems which can occur with these films include insufficient adhesion of the film to the magnetic layer and the requirement that the film be relatively thick to provide sufficient wear protection, thus increasing the distance between the head and the media, which in turn reduces allowable recording density Typically, after the carbon film is deposited on the media, a lubricant of polyfluoroether-type material with thickness up to 50 Å is deposited on top of the film material to improve the wear properties.

SUMMARY OF THE INVENTION

An object of the invention is to provide wear resistant, friction reducing materials, useful as thin protective coatings for applications such as magnetic recording disk media. The coatings are formed in a sputtering apparatus with a sputtering gas including nitrogen. The invention features films with enhanced nitrogen content formed at high deposition rates. A DC magnetron sputtering apparatus may be used by controlling the sputtering pressure and the electron bombardment of the substrate to enhance the nitrogen content of the film. The nitrogen content of the film can be reduced by increasing electron bombardment of the substrate or increasing collisions of the sputtered species in the plasma resulting in the disintegration of the species. The following techniques can be used to increase the nitrogen content of preferred films, e.g., with nitrogen in the 10-20 at. % range:

1. Apply a magnetic field gradient near the surface of the sputtering target to trap the emitted secondary electrons and to reduce the extent (distance) that the intense plasma region extends from the target surface. The magnetic field gradient also allows depositions at higher power densities, which is beneficial to increasing the nitrogen content of the films.
2. Apply ground shields and/or powered anodes to collect the electrons and reduce the bombardment of the sample surface.
3. Deposit at low gas pressures to minimize the collision of sputtered species with electrons or other energetic species that can result in the disassociation of clusters before they reach the substrate.

The amount of nitrogen incorporated in the films can therefore be controlled and thereby, certain advantageous properties of the materials may also be controlled. For example, films can be produced that exhibit properties consistent with a nano-structure morphology. These films are believed to be composed of a matrix of relatively large amount of carbon, and within the matrix are clusters of C—N bonded regions. The morphology of the film surface is believed to be randomly textured on the angstrom scale. This property increases the surface area of the film and is advantageous for retaining a thin film of lubricant material.

Generally, when a magnetic recording medium is coated with lubricant, a relatively uniform film of the lubricant material is provided on the surface. However, the lubricant is subject to disturbance by the centrifugal force imparted by the spinning of the medium at a high rate of speed. In addition, the recording head on occasion slides across the medium, pushing the lubricant away from the particular location, especially in the region of start/stop action. These problems can cause the lubricant to be depleted from the start/stop zone in a typical disk drive, and when the lubricant is depleted, rapid wear of the protective layer often follows. The materials according to the invention more tightly bind the lubricant, reducing the effect of these problems and resulting in longer-lasting recording media. The films of the invention also exhibit enhanced adhesion to the magnetic material, reducing delamination also arising from repeated contact of the head on the disk. Further, the films themselves are wear-resistant, which allows the use of thinner films with improved wear.

A DC magnetron is preferred for forming materials as described herein. The DC magnetron system can be operated without substantial heating of the substrate by bombardment of plasma particles, such as electrons, during the deposition. Deposition is possible on thin, fragile, and otherwise heat sensitive substrates such as plated magnetic recording alloys, without variation of the magnetic properties. Plated magnetic media are typically deposited from an aqueous solution, such as an electrochemical bath. In addition, the technique is particularly useful for commercial production facilities, since both sides of a recording disk can be simultaneously coated without the use of heat sinks, etc. The temperature of the deposition substrate can be carefully controlled.

In a first aspect, the invention features a method for forming a hard protective film material having the empirical formula:

$$C_xN_y$$

by providing a sputter apparatus including a vacuum chamber and incorporating therein a carbon target and a deposition substrate. Within the vacuum chamber, an inert sputter gas including nitrogen is provided. An electric field is applied in the region of the target for ionizing the sputter gas and causing sputtering from the target and deposition of the material on the substrate. The method includes controlling the density of electrons in the chamber in the region of the substrate.

In various aspects, the invention includes the following features. The sputter apparatus is a magnetron apparatus and the electron density is controlled by a magnetic field in the region of the target for confining the electrons. The pressure in the chamber and the separation between the target and deposition substrate are controlled to affect the amount of nitrogen in the material. The pressure is in the range of less than about 25 microns and the separation between the target and the substrate is in the range less than about 12 inches. More preferably, the pressure is in the range of about 3 to 8 microns and the separation in the range of about 1 to 3 inches. The amount of nitrogen in the film is about 10 at. % to 40 at. %, about 12 at. % to 18 at. %, or about 14 at. % to 16 at. %. The amount of nitrogen gas in the chamber is in the range of about 30 to 60 percent of the total sputter gas. The power density of the electric field is controlled in the range of about 2 to 8 W/cm². The chamber includes an anode or grounded member for reducing electron bombardment of the substrate. The substrate is a magnetic material. The magnetic material is a plated magnetic material. The substrate temperature is about 100° C. or less during deposition. The substrate may also be a sputtered magnetic medium.

In another aspect, the invention features a hard protective material having the empirical formula:

$C_xN_y$ where the amount of nitrogen is about 10 at. % to 40 at. %.

In various aspects, the invention also features the following. The amount of nitrogen is between about 12 at.% to 18 at.%, or about 14 at % to 16 at. %. The material includes a matrix predominantly of carbon with randomly dispersed regions of carbon-nitrogen bonds. The surface of the material includes a textured surface having an irregular morphology. The material is formed as a film on a magnetic recording substrate. The material includes a lubricant on top of the film. The lubricant is a perfluoroether lubricant. The lubricant is about 20 Å thick or less. The recording medium is a plated recording medium or a sputtered magnetic recording medium.

In a particular aspect, the invention features a method for forming a magnetic recording media having a hard protective film with the empirical formula:

$C_xN_y$ where the amount of nitrogen is about 10 at. % to 20 at. %, by providing a magnetron sputter apparatus including a vacuum chamber and incorporating therein a carbon target and a magnetic recording medium deposition substrate. Within the vacuum chamber an inert sputter gas including nitrogen in the range from about 30 to 60% of the total gas concentration is provided. A magnetic field in the region of the target is applied with a maximum field strength in the range of 200-500 gauss for controlling the density of electrons in the chamber and an electric field is provided of power density in the range of about 2 to 8 W/cm² for ionizing the sputter gas and causing sputtering from the target and deposition of the film on the substrate. The pressure in the chamber is controlled in the range of about 3 to 8 microns and the separation between the target and effect the amount of nitrogen in the medium.

Particularly, the amount of nitrogen in the film is about 14 at. % to 16 at. %, the substrate is a plated magnetic material, preferably a cobalt-nickel phosphorous alloy, and the substrate temperature is about 100° C. or less during deposition. The substrate may also be a sputtered magnetic material such as cobalt titanium, cobalt nickel, cobalt platinum, cobalt chromium tantalum, cobalt chromium and mixtures thereof.

In another particular aspect, the invention features a magnetic recording medium, with a magnetic substrate material and a hard protective film on the surface of the substrate having the empirical formula:

$C_xN_y$ where the amount of nitrogen is about 10 at. % to 20 at. %, and the thickness of the film being about 200 Å or less.

Particularly, the medium includes a perflouroether lubricating film on the surface of the film, with a thickness on the order of about 20 < or less and the magnetic medium is a plated magnetic medium, preferably a cobalt-nickel-phosphorous alloy. The medium may also be a sputtered magnetic medium such as cobalt titanium, cobalt nickel, cobalt platinum, cobalt chromium tantalum, cobalt chromium, and mixtures thereof.

Other features, aspects and advantages follow.

BRIEF DESCRIPTION OF THE DRAWINGS

FIG. 2 is a top view schematic illustration of a magnetron sputtering apparatus, adapted for coating two opposed surfaces of a substrate, simultaneously;

DESCRIPTION OF THE PREFERRED EMBODIMENT

Material

Nitrogen-containing carbon materials having advantageous wear, friction and adhesion properties can be produced having the empirical formula:

$C_xN_y$

Typically the amount of nitrogen is about 10 at. % to 40 at. (y=0.1 to 0.4). The remainder of the material is substantially carbon (x+y=1.0). Materials with nitrogen in the range from about 10-20 at. %, especially about 12-18 and 14-16 at. %, have been found particularly useful. Minor, contaminant amounts (less than about 10 at. %, usually trace amounts less that 3 at. %) of oxygen or hydrogen may also be present in films formed of the material. Small amounts of inert sputter gas molecules, e.g., argon may be trapped in the film during deposition. The materials are advantageous for applications such as the coating of magnetic recording media. The coatings allow the use of thin (e.g., 20 Å or less) lubricant films with superior friction and wear properties. It is believed the materials are substantially amorphous with regions of crystallinity and exhibit an irregular texture on the atomic scale arising from clusters of carbon-nitrogen bonded materials randomly dispersed within a matrix of amorphous carbon material. On a macroscopic level or the surface of, e.g., a 9 inch disk, the films may be smooth, generally not exhibiting deviations from greater than about 5 microinch, in some cases less than 1 microinch, allowing a low flying height of the recording head without crashing. (It will be understood that the substrate itself may have deviations up to 1 mil.) Yet on the atomic scale, irregular film texture provides a high surface area, allowing liquid lubricants to be applied and retained with resistance to spin-off or disturbance from contact with the head.

Figure 1:
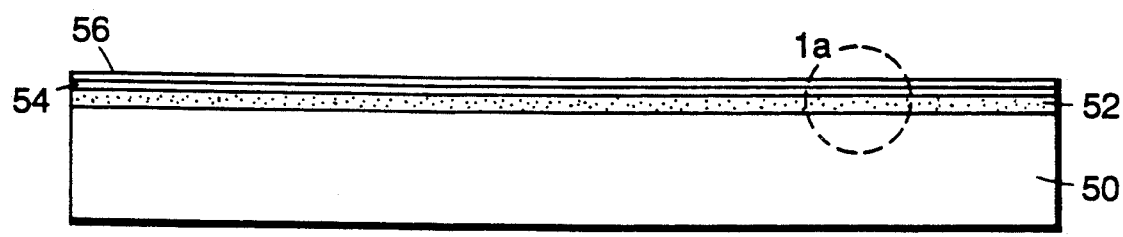
FIG. 1 is a cross-sectional view of a magnetic disk according to the invention.
Figure 1A:
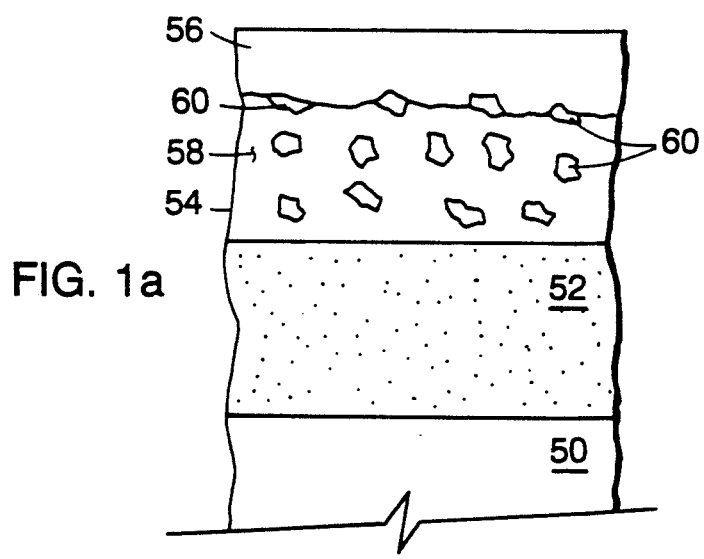
FIG. 1a is an enlarged view of a portion of the disk in FIG. 1.

Referring now to FIGS. 1 and 1a, views of a magnetic disk in accordance with the invention are shown. The disk is e.g., a 5.25 or 9 inch diameter magnetic recording disk having an aluminum substrate 50, about 75 mils thick, upon which a plated magnetic layer 52 of cobalt-nickel phosphorous, about 1 to 3 microinch thick, has been deposited. A nitrogen containing, hard carbon film 54, preferably 200 Å thick is deposited on the magnetic layer A thin film 56, about 15 Å, of a perfluoroether lubricant of MW in the range of 1500-20,000 particularly around 2000-4000 (e.g. AM2001®, ZDOL-4000®, ZDEAL®, Z25 from Monteflous, Italy or Krytox® 143 and 157, E.I. Dupont, Wilmington, Del.); is deposited on the nitrogen containing film. As illustrated, most clearly in FIG. 1a, the nitrogen containing film 54 is believed to be characterized by a carbon matrix 58, having regions 60 in which nitrogen has been incorporated. The surface of the nitrogen film is believed to have a textured morphology on the order of about 5 Å (peak to valley) or less, giving the nitrogen film surface a large surface area for retaining the perfluoroether lubricant.

SYNTHESIS

The materials can be produced by proper control of a sputtering apparatus. To control the amount of nitrogen in the film, the number and/or likelihood of collisions between sputtered species and the sputter gas is controlled, as well as the bombardment of the substrate and the film being formed, by electrons. To control collisions the total gas pressure (hence, the mean free path of the sputtered particles) in the deposition chamber and the separation between the target and substrate must be properly adjusted. By decreasing the pressure and target to substrate separation, the amount of nitrogen in the films is increased. To control bombardment of the substrate, electron-confining fields may be employed. The density of electrons in the region of the substrate is less than would occur, absent the confining fields. In particular embodiments utilizing a DC magnetron, for example, the magnetic field profile (field-strength gradient) is adjusted to limit electron bombardment. The target to substrate separation also may be adjusted to position the substrate outside the region of high magnetic field intensity and thus electron density. An anode or grounded shield-member positioned in the chamber, for example, in the form of a ring about the target, may be used to attract electrons away from the substrate. Such an anode may be useful especially for very small separations, e.g. 1 inch or less, where magnetic fields from the target may extend to the region of the substrate. A negative potential can also be applied to the substrate to discourage electron bombardment. The strength of the fields produced by cathodes can also be controlled to effect bombardment. Selection of power and pressure, as described, is believed to enhance the formation of nitrogen-bonded clusters at the surface of the sputter target. In all cases, the sputter gas includes nitrogen and preferably includes a gas mixture of nitrogen and an inert species such as argon. Low molecular weight species, such as hydrogen or helium are substantially precluded. In general, for a given total gas pressure, the amount of nitrogen in the films increases with increasing amounts of nitrogen in the sputter gas. In embodiments using a gas mixture including nitrogen in the chamber, the total gas pressure may be adjusted by adjusting the amount of argon, while holding the nitrogen amount constant.

The deposition surface need not be preheated. This is of particular advantage for deposition on heat-sensitive substrates such as plated magnetic recording media. It has been found that adhesion of sputtered coatings without nitrogen, can be improved by preheating the disk, e.g., in excess of 200° C. However, magnetic properties of heat-sensitive materials begin to change at preheat temperatures around 100° C. Nitrogen containing films exhibit good adhesion at low or no preheat. On plated media, the films exhibit superior adhesion without substantial preheat which may be caused by the reaction of nitrogen with the substrate in the initial phase of deposition. In some systems, not preheating the disk is believed to be advantageous because water from the surrounding environment is not released to the gas phase where it could be entrapped in the depositing films. Under non-preheated conditions, water present on the deposition surface is believed to be removed by reactive, e.g., nitrogen, species. For particular deposition apparatus, such as the magnetron described below, the target surface is positioned away from the plasma and is not heated by electron bombardment during deposition.

Operation under the conditions described also increases the deposition rate. It is believed that nitrogen impinging on the target reacts with the carbon target. These reacted species are more likely to be dislodged from the surface of the target by subsequent impact. The rate of deposition with nitrogen present in the sputter gas is typically 2-3 times the rate absent nitrogen. The deposition rate increases with increasing amounts of nitrogen in the sputter gas. Deposition rates on the order of 1-50 Å/second are achieved.

The invention will be further described by the following examples of materials formed in a magnetron sputter apparatus. In all the examples, the magnetic field strength was in the range of 200-500 gauss. In the experiments, ESCA and Auger measurements of nitrogen in the films represent bulk measurements made after removal of the surface by bombardment with e.g. Ne or Ar to a depth of about 5 nm.

EXAMPLE 1

Referring to FIG. 2, a magnetron sputtering apparatus for production, two-sided coating of substrates 4, e.g., plated magnetic recording disks, includes a substrate pallet 8 movable on a track 9 in the direction of arrows 11 and a magnetron source assembly 6, all positioned in a vacuum chamber 10. Magnetron apparatus, in general, are known in the art. Systems which are suitable for modification and operation as discussed herein are commercially available (e.g. model V-2000, Circuit Processing Apparatus, Fremont Calif.; systems also available from Leybold, Hannau, Germany). The substrates may be heat-sensitive plated magnetic layers such as cobalt-nickel phosphorous alloys or sputtered layers such as cobalt-titanium, cobalt nickel, cobalt platinum, cobalt chromium tantalum, cobalt-chromium-, and mixtures thereof, etc. Typically, the latter include a chromium underlayer of thickness 100-3000 Å to control magnetic properties. The magnetic material is typically provided on an aluminum, glass, or ceramic substrate. The pallet can be heated prior to deposition by a heat source 50 upstream of the sputter source, e.g., either quartz lamps or infrared-type heaters. Typically, for heat sensitive materials, the pallet is not preheated or heated to temperatures about 100° C. or below. For non-heat sensitive materials, such as sputtered magnetic layers, the pallet is preheated in the range of 200–250° C. prior to deposition. Films formed on substrates with or without preheat exhibit advantageous properties.

The source assembly 6 includes a cathode 20 (copper) with a carbon target 21 (e.g., 11 inch by 29 inch; 0.25–0.5 inch thick graphite, 99.99 or 99.999 Pure Carbon Target, available from Degussa, Morgan Hill, Calif.) solder bonded or clamped so as to be positioned in the field of magnet assembly 22 (field strength from 50 to 1500 gauss, especially 200–500 gauss at the target surface). The field strength and profile are selected to control the density of the plasma in the proximity of the substrate to control the electron bombardment of the substrate. The target includes a ground shield 23 that extends about its periphery. Typically the ground shield is positioned about 0.125 inch above the target. Positioning the ground shield has been found to effect the nitrogen content of the films at the periphery of the substrate since, it is believed, the ground shield attracts electrons, reducing bombardment of the substrate periphery. The ground shield could also be charged to act as an anode or a separate anode member could be provided positioned between the shield and substrate. A DC voltage source 24 is provided for the application of voltage (300 to 1200v, most preferably, 600–800 v) to the cathode 20 with an operating current in the range of about 1 to 8 amps. The DC power is generally in the range of about 1–20 kwatts, but may be higher than 20 kwatts with adequate source cooling. The power density typically is in the range of 0.5 to 20W/cm$^2$ (based on the area of the target), especially 2–8 W/cm$^2$. Recirculation apparatus 12 provides cooling water to the source assemblies 6 e.g. in the range of 50° C. The walls of the chamber are at room temperature. As illustrated, the source assemblies 6 may be provided on a sliding mechanism 14 to allow adjustment of the separation $d_s$ between the target 21 and substrate 4 over the range of about 0.75 to 12 inches, most preferably in the range of about 2 to 3 inches or less. (It will be understood that for commercial systems the separation may be at a preset value or alternatively an adjustable system may be employed to form films with varying compositions as a function of depth, by adjusting $d_s$ during deposition.) The chamber is evacuated with a vacuum pump 36 to maintain pressures in the range of about 1 to 25 microns Hg, especially 3 to 8 microns. A gas source 40 with metering valves 42, 44, allows carefully controlled, metered flow of a sputter gas mixture of nitrogen and another, inert gas such as Argon, into the chamber. Typically, the gas is about 30–80%, preferably 40–60% nitrogen, for production of film with superior adhesion to magnetic media and superior retention of perfluoroether-lubricants.

Figure 3:
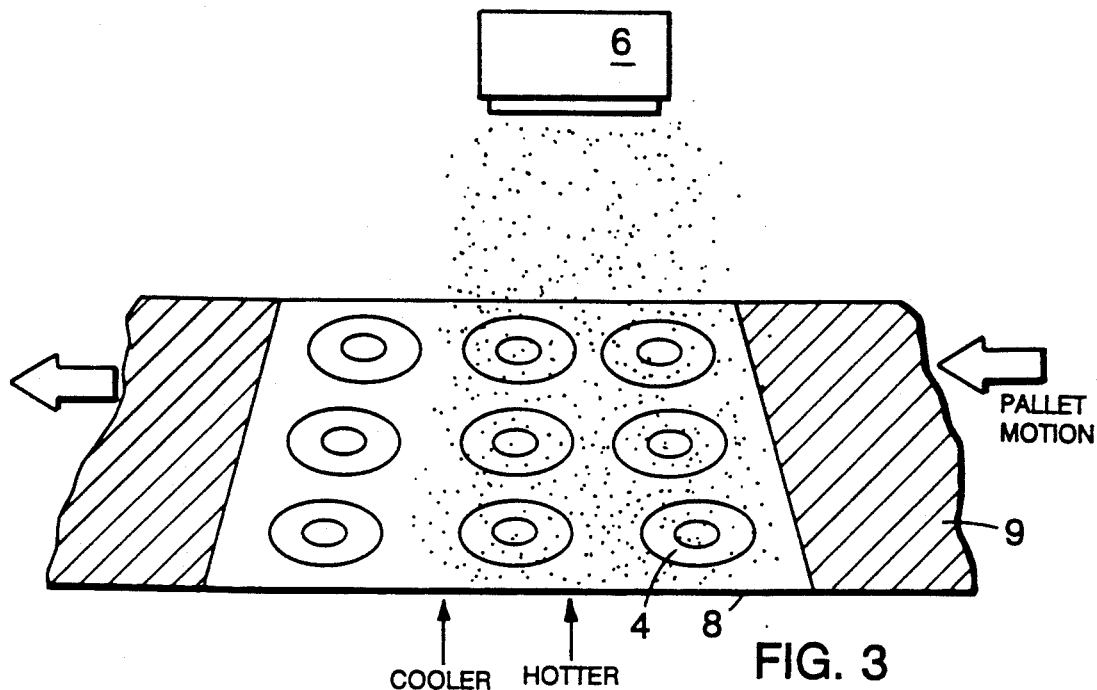
FIG. 3 is a schematic illustration of the motion of substrates through sputtered material.

Referring as well to FIG. 3, the pallet 8 supporting the substrates 4 translates with respect to the magnetron source 6 . In particular applications, the speed of the pallets is on the order of 30 to 70 cm per minute. In production equipment, typically 2 to 6 sputter sources are arranged in series. The active deposition zone from the source is roughly 10 to 25 cm wide, and the substrates are exposed to the sputtering material for roughly 0.5 minutes for each source. The thickness of the films is in the range of about 50 to 300 Å, typically around 200 Å. Films as thick as about 500 Å as well as much thinner films can be used in some applications.

Figure 4:
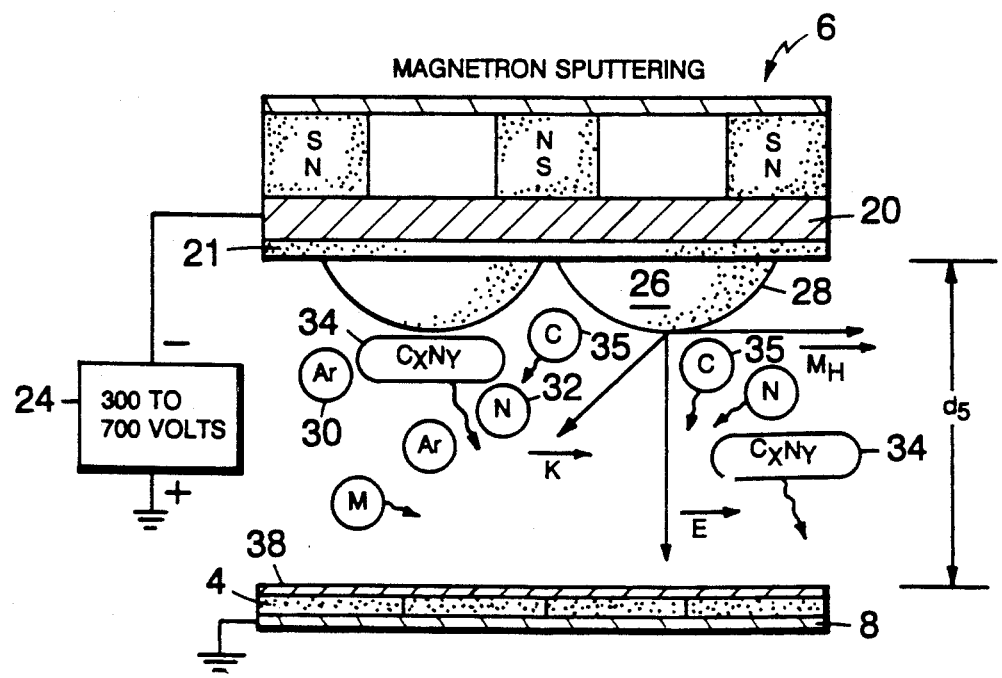
FIG. 4 is a schematic illustration of sputtering phenomena in a magnetron apparatus.

Referring now to FIG. 4, during operation of the sputtering apparatus, electrons are emitted from the surface of the target 21, being repelled by the negative charge of the target, but confined by the magnetic field 26 to a "racetrack" region 28 near the target surface. As illustrated, the intense plasma region does not extend to the substrate 4. In the region 28 of electron flow, ionization of the sputter gas species such as argon atoms 30 and nitrogen atoms 32 occur, which ions accelerate into the target. The collision of the ionized species with the target results in sputtering of material, including it is believed, carbon-nitrogen clusters 34 and carbon clusters 35 which drift from the target area to the deposition substrate 4, forming a film 38. During the sputtering, reaction of nitrogen with the carbon target occurs and, it is believed, subsequent collisions result in dislodging of the C—N species in clusters. Typically, sputtered material travels to the substrate by means of the momentum imparted from sputtering collisions. Generally, the material sputtered is neutral and therefore unaffected by the electric or magnetic field. A reactive gas, such as nitrogen, can produce negatively charged particles. These particles generally lo have sufficiently high mass so that the magnetic field is not as effective in containing them, and it is believed that negative particle or cluster bombardment occurs during the production of the materials described.

Figure 5:
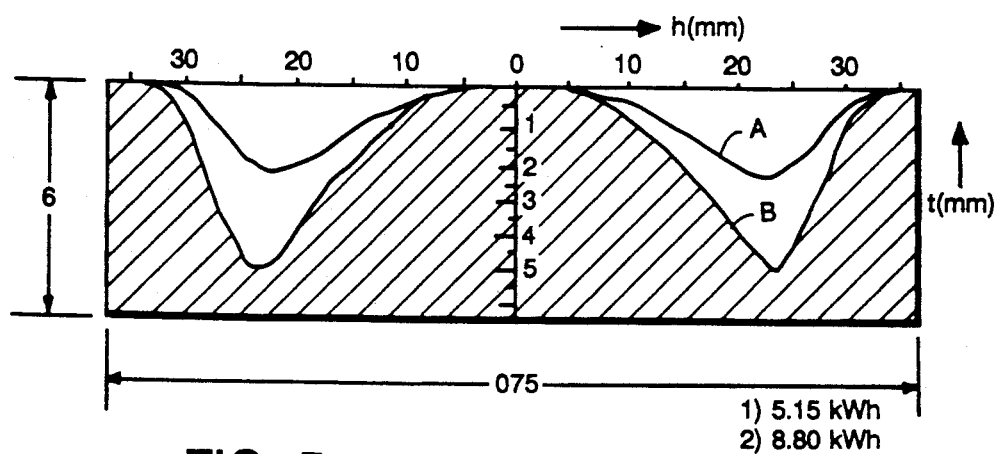
FIG. 5 is a graph illustrating the erosion of target material in a magnetron sputtering apparatus.

The high current density of electrons causes a large number of collisions with argon atoms in the region 28, creating a high intensity argon or other gas plasma. In FIG. 5, the profile of the target is indicated after different stages of use. The target, originally of uniform thickness, after approximately 35% of its life has the profile of the target is shown by line A. After 90% of its useful life the target profile is shown as line B. The maximum erosion of the target in both cases occurs in the region where the magnetic field, and hence bombardment intensity, is greatest.

Figure 6:
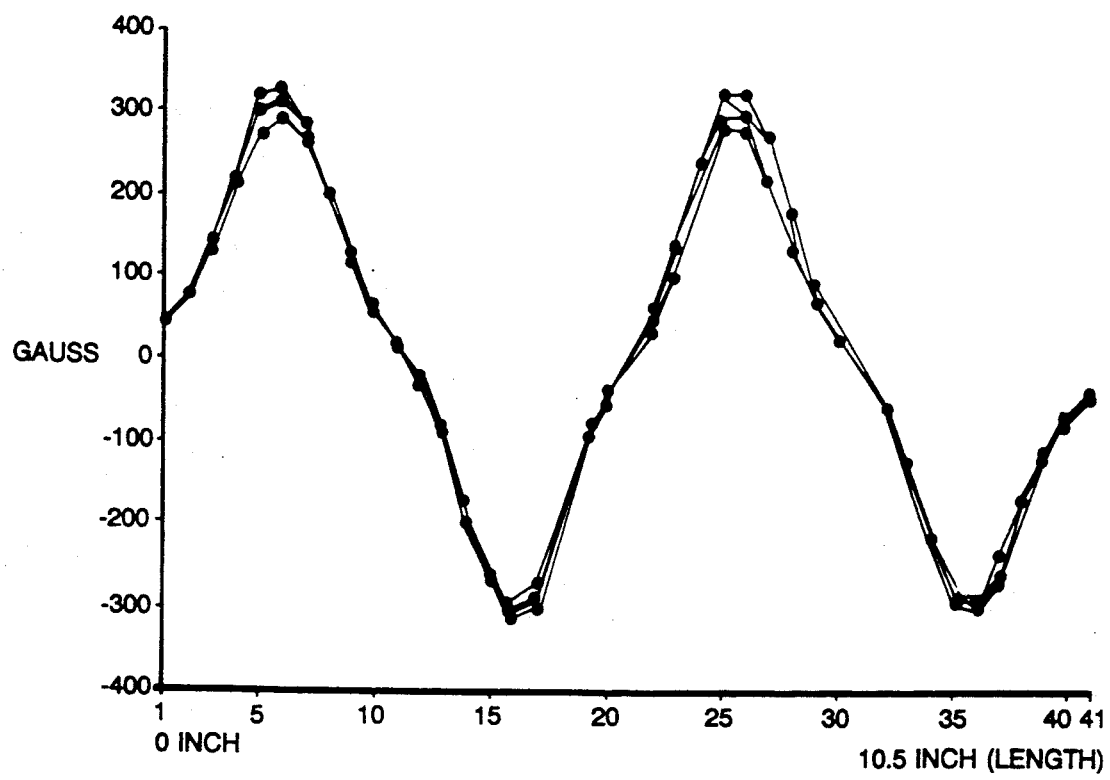
FIG. 6 is a plot of the magnetic field profile across a carbon target.

Referring now to FIG. 6, a profile of the magnetic field across the surface of the target (11 inches long) is illustrated. In this example, the profile is a "double race track" configuration, having a pair of regions of high plasma density, corresponding to the two sets of field strength minima and maxima. The width or sharpness of the maxima can be increased to confine the plasma more closely to the target, reducing bombardment at the substrate . Each trace represents a different position along the width of the target, indicating substantial uniformity. Each measurement along the length was taken at positions separated by 0.25 inch. As the target erodes as illustrated in FIG. 5, the magnetic field strength at the target surface increases with the surface of the target getting progressively closer to the magnet.

The materials, in the following examples, were produced in a DC magnetron apparatus, operated consistently with the above description. All substrates were plated magnetic media, unless otherwise noted.

EXAMPLE 2

Plated disks were run at different gas pressures to examine the effects on composition. For 40%, 50%, and 60% N$_2$ gas in the sputter gas, disks were analyzed by ESCA/Auger analysis. The "lead" and "trail" pallet positions correspond to the disks that encounter the plasma first and last, respectively. The power density was about 3 W/cm$^2$. The target size was 29 inch by 5 inch. The separation ($d_s$) was about 2 inch. Other deposition parameters are in the following table, in the following order: total gas pressure, amount of $N_2$ gas in sputter gas, disk preheat temperature, track speed in cm/min, number of cryopumps operating and total gas flow rate in standard cubic centimeters (cc) per min. Other parameters are consistent with Example 3.

| | | Auger film Measurements | |
|---|---|---|---|
| Pallet | Lead | Trail | Conditions |
| 1 | HL9 | HL0 | 15 MICRONS, 50% N2, 2.8 A, 100 C., |
| | HL2 | HPB | 90 CM/MIN, 1 CENTER CRYO |
| | HL7 | HN8 | ONLY, 165 SCCM |
| HL0 COMP = C 88.4%, N 9.0%, O 2.4% | | | |
| 2 | F9Z | HL6 | 5 MICRONS, 50% N2, 2.8 A, 100 C., |
| | F9N | HMB | 90 CM/MIN 5 CRYOS (3 CENTER, |
| | F9T | HL4 | 1 EACH LOADLOCK) 185 SCCM |
| HL6 COMP = C 85.4%, N 12.9%, O 1.6% | | | |
| HMB COMP = C 82.0%, N 16.2%, O 1.7% | | | |
| HL4 COMP = C 84.3%, N 13.5%, O 2.0% | | | |
| 3 | HZH | F9Y | 2 MICRONS, 50% N2, 2.8 A, 100 C., |
| | HZJ | F90 | 90 CM/MIN, 5 CRYOS, 115 SCCM |
| | F9S | F91 | |
| FY9 COMP = C 84.5%, N 13.7%, O 1.5% | | | |
| 4 | HRP | H17 | 5 MICRONS, 40% N2, 2.8 A, 100 C., |
| | HRZ | HN3 | 90 CM/MIN, 5 CRYOS APPROX. |
| | HRH | H75 | 185 SCCM |
| H17 COMP = C 84.0%, N 14.3%, O 1.5% | | | |
| 5 | H5V | H50 | 5 MICRONS, 60% N2, 2.8 A, 100 C., |
| | H5Y | H51 | 90 CM/MIN, 5 CRYOS APPROX. |
| | H5Z | HP9 | 185 SCCM |
| H50 COMP = C 83.1%, N 15.8% O 1.0% | | | |

The data from pallets 1, 2, and 3, each with 50% $N_2$ in the sputter gas but a total pressure of 15, 5, and 2 microns, respectively, indicate nitrogen content decreases with increasing total pressure. These measurements are indicative of a deposition model in which $C_xN_y$ clusters are formed at the target and transported to the substrate. Some clusters dissociate in transit due to collisions in the plasma, releasing nitrogen to the plasma, thus reducing the amount of nitrogen incorporated in the film.

EXAMPLE 3

A series of plated cobalt-nickel disk substrates were used to examine the effect of $d_s$, target to substrate distance, and magnetic field strength profile on the film composition. Disks with 10%, 30%, and 50% $N_2$ in the sputter gas were studied, with $d_s$ at about 3 inches in a deposition system using a dual racetrack magnet system. A run at 50% $N_2$ in the sputter gas was performed with a $d_s$ of about 2 inches using a single racetrack system, known to more closely confine the plasma then the above dual racetrack magnet. The DC power was 8 kW, and the total gas pressure was 5 mtorr. The source target dimension was 29 inches by 11 inches for the dual racetrack system and approximately 29 inches by 6 inches for the single racetrack system. The power density was 4 W/cm² averaged over the target surface. The preheat is measured in the time (seconds) exposure to the preheat chamber. The temperature of the substrates ranged from about 65°-200° C. Elementa analysis of films was conducted by ESCA, with the following results.

| Disk | Conditions | N | C | O | Ar | Spacing (ds) | Magnets |
|---|---|---|---|---|---|---|---|
| CXA44321 | 10% N2/ 38 sec | 8.3 | 90.6 | 0.8 | 0.0/ 99/7 | 3" | dual racetrack |
| CXA44322 | 10% N2/ 10 sec | 9.5 | 89.7 | 0.7 | 0.0 | 3 | dual racetrack |
| CXA44320 | 30% N2/ 24 sec | 12.7 | 86.0 | 1.1 | 0.0 | 3 | dual racetrack |
| CXA44313 | 30% N2/ 24 sec | 12.6 | 86.4 | 0.7 | 0.0 | 3 | dual racetrack |
| CXA44315 | 50% N2/ 10 sec | 12.6 | 86.1 | 1.1 | 0.0 | 3 | dual racetrack |
| CXA44314 | 50% N2/ 38 sec | 12.2 | 86.3 | 1.3 | 0.0 | 3 | dual racetrack |
| TF4W02 | 50% N2 | 0, increases with N 16.0 | 83.0 | 0.8 | 0.0 | 2" | single racetrack |

Run TFC4W02 at $d_s=2$ inches with a high-strength ceramic magnet has nitrogen content, about 16%, higher than the 12-13% measured range for films CXA44314 and CXA44315 deposited at $d_s=3$ inches with a rubber magnet, under the same nitrogen content in the sputter gas. The smaller $d_2$ spacing and higher magnetic confinement during deposition of the TFC4W02 film resulted in increased nitrogen content. Auger depth profiles were also performed on the TFC4W02 sample and on CXA44314. The nitrogen level in the sample was between 12-13% for the CXA44314 sample, and between 14-16% for TFC4W02 sample. No substantial nitrogen concentration gradients were observed in either film. As indicated by samples CXA44320, CXA44313, CXA44315 and CXA44314 at a given $d_s$ in the 30-50% $N_2$ range, the nitrogen content of the film does not substantially depend on the $N_2$ content of the gas.

EXAMPLE 4

The deposition rate as a function of gas content and substrate temperature was studied by the following experiment. A series of plated cobalt-nickel disks were placed in a chamber with 10%, 30%, and 50% $N_2$ in the sputter gas, as in Example 3, to examine the effect of $N_2$ gas concentration and preheat on deposition rate. The preheat is measured in the time (seconds) exposure to the preheat chamber. The temperature of the substrates ranged from about 65°-200° C. Other parameters were consistent with Example 3.

| Disk # | N2 % | Preheat | Thickness | Comments |
|---|---|---|---|---|
| 44321 | 10 | 38 sec | 74 nm | Track speed = 20 cm/min |
| 44322 | 10 | 10 sec | 73 nm | |
| 44320 | 30 | 24 sec | 93 nm | |
| 44312 | 30 | 24 sec | 96 nm | |
| 44315 | 50 | 10 sec | 118 nm | |
| 44314 | 50 | 38 sec | 117 nm | |
| 44312 | 30 | 24 sec | 43 nm | Track speed = 40 cm/min |

The results indicate that substrate temperature in this range does not appreciably affect the deposited film thickness, while gas composition has a dramatic effect on deposition rate.

Figure 7:
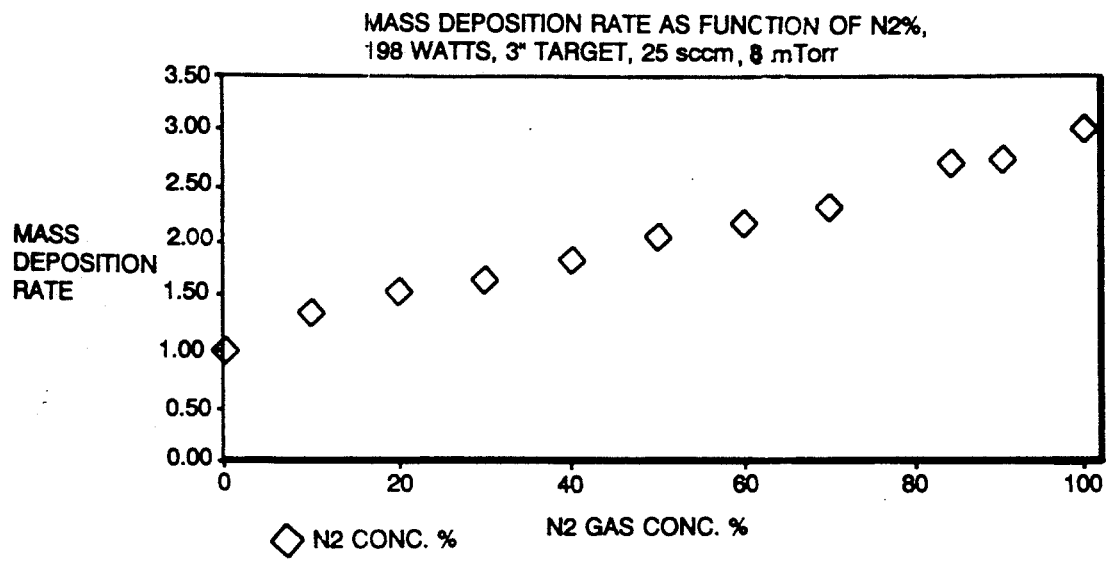
FIG. 7 is a plot of mass deposition rate as a function of nitrogen gas concentration.

Referring to FIG. 7, mass deposition rate is plotted as a function of nitrogen concentration in the sputter gas for a power of 198 watts (for three inch target, density about 4 W/cm²), 3 inch separation, gas flow of 25 SCCM, and total pressure of 8 mtorr.

As the results indicate, the deposition rate increases with increasing nitrogen gas concentration in the sputter gas.

EXAMPLE 5

The deposition rate with a sputter gas composition of 50% N₂/50%Ar was compared between experiments conducted over an extended time of six months. Sample AX341 was prepared about six months prior to AX374.

| | Sputter Conditions: 8 KW/5 mTorr/50% N2—50% Ar/ | |
|---|---|---|
| | track speed | thickness of carbon |
| AX341: | 12 cm/min | 2000 Angstroms (experimental: Dektak) |
| | 84 cm/min | 285 Angstroms (calculated) |
| AX374 | 20 cm/min | 1180 Angstroms (experimental: Dektak) |
| | 84 cm/min | 280 Angstroms (calculated) |

This result at the same track speed of 84cm/min shows the difference in the deposition rate was less than 2% between the experiments.

EXAMPLE 6

The nitrogen content of the films as a function of current (indicative of power density) was investigated. Data was taken by ESCA and Auger (after 1 min of raster etch 10×10 mil area). A current of 1 amp corresponds to a power density of about 0.75 W/cm². The track speed was altered so that sample thickness was substantially equal.

| Disk | Current | Speed | N ESCA | N Auger | Comments |
|---|---|---|---|---|---|
| TFC6HSL | 1 A | 8 cm/min | 13.6 | 14.1 | 100 C. |
| TFC6HS6 | 2 A | 16 cm/min | 15.3 | 16.1 | No Heat |
| TFC6HB6 | 4 A | 32 cm/min | 14.8 | 15.8 | 100 C. |
| TFC6HCD | 6 A | 48 cm/min | 16.0 | 15.7 | 100 C. |
| TFC6HSV | 8 A | 64 cm/min | 15.6 | 16.0 | 100 C. |

The data indicates that between 2 A and 8 A little change in N content in the film occurs.

EXAMPLE 7

The following experiment was conducted to evaluate the effect of N₂ concentration in the sputter gas and disk temperature on the durability and wear mark resistance of the films. The films were formed on plated magnetic disks preheated in the temperature range of 50 to 150° C. to minimize the heating of the disk necessary to achieve good durability. Previous experiments have shown the magnetic properties of electro-plated media begin to change at temperatures in the 90°-100° C. range and above. These films were prepared under constant sputtering power (2.8 A) with the track speed varied to achieve the targeted thickness (285 angstoms). Thickness calibration runs were performed for each condition prior to the deposition on the disks. A perfluoroether lubricant with a nominal thickness value of angstroms was used. Four pallets of six disks were run for each condition.

The wear properties were tested in a recording apparatus simulator. Two response variables were tested. The first, SScycles, is the average number of S/S cycles to failure for 8 surfaces using the conventional criteria. The second is a qualitative assessment of the wear at the end of the test. These tests were run using an accelerated wear test where the disk is spun at 200 ips during the flying portion of the test. The test stops when the friction fails to fall below a threshold value during the 200 ips portion of the test.

| Run # | N2 % | Preheat | SS Cycles | Wear |
|---|---|---|---|---|
| 1 | 40% | 50 C. | 8156 | 2.5 |
| 2 | 40% | 100 C. | 7552 | 1.7 |
| 3 | 40% | 150 C. | 7969 | 3.0 |
| 4 | 50% | 50 C. | >10000 | 2.7 |
| 5 | 50% | 100 C. | >9995 | 3.3 |
| 6 | 60% | 150 C. | >10000 | 3.0 |
| 7 | 60% | 50 C. | >10000 | 1.3 |
| 8 | 60% | 100 C. | >10000 | 3.0 |
| 9 | 60% | 150 C. | >10000 | 3.0 |

Wear Mark Index
0 - No wear mark visible
1 - Very very light wear mark (hard to find but is there)
2 - Very light wear mark (barely visible)
3 - Light wear mark (easily visible but carbon is not spotting yet)
4 - Wear Mark (carbon is starting to look uneven)
5 - Crashed or deep scratch from on or both rails The tests indicate the formation of durable films that exhibit low wear. When these disks were subjected to a standard start/stop test at 450 ips all disks passed and no wear marks were observed.

EXAMPLE 8

An experiment to measure the friction properties of disks coated with various materials was conducted. As listed in the table below, films of various thickness, having lubricants of varying thicknesses were tested. Experiments were performed by a start/stop test in which the head is allowed to dwell on the disk for a period and the initial resistance to motion (stiction) is measured, as known in the art. The test was stopped at 2400 CSS cycles. There is a one hour dwell at 2000 cycles and a ten minute dwell at 2400 cycles. All carbon/nitrogen films (types 1-5) were formed with 50% Ar/N₂ in the chamber with a total gas pressure of 5 mtorr. A sputtered cobalt-chromium-tantalum disk was used as the substrate.

| | Disk S/N | Max. Friction (8) |
|---|---|---|
| Baseline, 285Å film | CXB21838 | 9.5 |
| 25Å Lube, Argon | CXB22122 | 17.7 |
| Type 1, 185Å film | CXB22756 | 21.2 |
| 35Å Lube, Argon/Nitrogen | CXB22747 | 17.2 |
| | CXB22748 | 12.2 |
| | CXB22768 | 13.2 |
| Type 2, 185Å film, | CXB22889 | 6.9 |
| 15Å Lube, Argon/Nitrogen | CXB22831 | 6.1 |
| | CXB22746 | 5.6 |
| Type 3, 385Å film, | CXB22627 | 12.5 |
| 35Å Lube, Argon/Nitrogen | CXB22673 | 15.6 |
| | CXB22672 | 22.5 |
| Type 4, 385Å film, | CXB22631 | 11.0 |
| 15Å Lube, Argon/Nitrogen | CXB22555 | 16.7 |
| Type 5, 285Å film, | CXB22692 | 6.5 |
| 25Å Lube, Argon/Nitrogen | CXB22687 | 34.0 |

As the results indicate, optimum friction is obtained by type 2, a carbon nitrogen film with thickness of about 185Å with a lubricant thickness of about 15Å.

EXAMPLE 9

Figure 8:
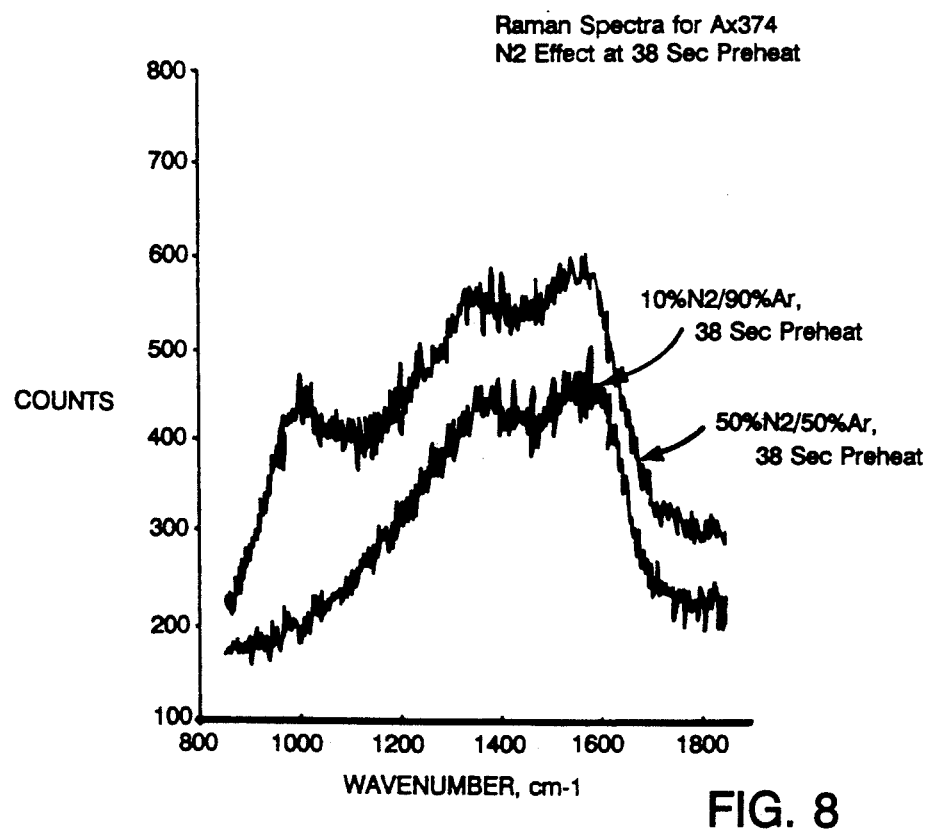
FIG. 8 is a comparison plot of Raman spectra of films formed under different conditions.

Raman spectra of films formed under conditions of 50% N₂ and 10% N₂ according to Example 3 were obtained. Referring to FIG. 8, the films formed with 50% N₂ exhibit a prominent band at 1000 cm$^{-1}$ that is believed to be indicative of $C_xN_y$ structures. It is also believed that incorporation of nitrogen results in the synthesis of pyridine-like structures which enhance the affinity of the film to the metal underlayer and the above mentioned lubricant to the film. The increased affinity of the lubricant has been observed by the dependence of the lubricant thickness on the concentration only, independent of the drain rate, in a conventional dip coater.

OTHER EMBODIMENTS

The materials can be applied to flexible magnetic materials as well, in which the substrate is typically made of aluminum coated with a nickel phosphorous layer. Materials can be produced with higher substrate preheat if the substrate materials are not heat sensitive, e.g., deposition on ceramics, glass, etc. Depositions may be carried out by other means consistent with the present teaching using, e.g., an RF magneton system.

Still further embodiments are within the following claims.

We claim:

1. A method for forming a hard protective film material having the empirical formula:

$$C_xN_y$$

comprising:
   providing a sputter apparatus including a vacuum chamber and incorporating therein a carbon target and a deposition substrate,
   providing within said vacuum chamber an inert sputter gas including nitrogen,
   applying an electric field in the region of said target for ionizing said sputter gas and causing sputtering from said target and deposition of said material on said substrate, and
   controlling the density of electrons in said chamber in the region of said substrate to cause the amount of nitrogen in said material to be within a selected range.

2. The method of claim 1 wherein said sputter apparatus is a magnetron apparatus and further comprising controlling said electron density by applying a magnetic field in the region of said target for confining said electrons.

3. The method of claim 1 further comprising controlling the pressure in said chamber and the separation between said target and deposition substrate to cause the amount of nitrogen in said material to be within said selected range.

4. The method of claim 3 further comprising controlling the pressure in the range of less than about 25 microns and controlling the separation between the target and the substrate in the range less than about 12 inches.

5. The method of claim 4 further comprising controlling the pressure in the range of about 3 to 8 microns and the separation in the range of about 1 to 3 inches.

6. The method of claim 1 wherein said selected range for the amount of nitrogen in said film is about 10 at. % to 40 at. %.

7. The method of claim 6 wherein said selected range for the amount of nitrogen is about 12 at. % to 18 at. %.

8. The method of claim 7 wherein said selected range for the amount of nitrogen is about 14 at. % to 16 at. %.

9. The method of claim 1 further comprising controlling the amount of nitrogen gas in said chamber in the range of about 30 to 60 percent of the total sputter gas.

10. The method of claim 1 wherein the power density of said electric field is controlled in the range of about 2 to 8 W/cm².

11. The method of claim 1 further comprising, providing in the chamber an anode or grounded member for reducing electron bombardment of the substrate.

12. The method of claim 1 wherein the substrate is a magnetic material.

13. The method of claim 12 wherein said magnetic material is a plated magnetic material.

14. The method of claim 13 further comprising maintaining the substrate temperature at about 100° C. or less during deposition.

15. The method of claim 12 wherein the substrate is a sputtered magnetic material.

16. A method for forming a magnetic recording media having a hard protective film with the empirical formula:

$$C_xN_y$$

where the amount of nitrogen is in a selected range of about 10 at. % to 20 at. %, comprising:
   providing a magnetron sputter apparatus including a vacuum chamber, and incorporating therein a carbon target and a magnetic recording medium deposition substrate,
   providing within said vacuum chamber, an inert sputter gas including nitrogen in the range from about 30 to 60% of the total gas concentration,
   applying a magnetic field in the region of said target having a maximum field strength in the range of 200–500 gauss for controlling the density of electrons in said chamber,
   applying an electric field for producing power density at the target in the range of about 2 to 8 W/cm² for ionizing said sputter gas and causing sputtering from said target and deposition of said film on said substrate,
   controlling the pressure in said chamber in the range of about 3 to 8 microns and the separation between said target and deposition substrate in the range of about 1 to 3 inches, and
   selecting the strength of said magnetic field and at least one of the level of nitrogen in said sputter gas, the power density produced by said electric field, the pressure in said chamber, and said separation to cause the amount of nitrogen in said film to be within said selected range.

17. The method of claim 14 wherein said selected range for the amount of nitrogen in said film is about 14 at. % to 16 at. %.

18. The method of claim 16 wherein the substrate is a plated magnetic material.

19. The method of claim 18 wherein said substrate is a cobalt-nickel phosphorous alloy.

20. The method of claim 19 further comprising maintaining the substrate temperature at about 100° C. or less during deposition.

21. The method of claim 16 wherein the substrate is a sputtered magnetic material.

22. The method of claim 21 wherein said material is selected from the group consisting of cobalt-titanium, cobalt nickel, cobalt platinum, cobalt chromium tantalum, cobalt-chromium, and mixtures thereof.

* * * * *

UNITED STATES PATENT AND TRADEMARK OFFICE
CERTIFICATE OF CORRECTION

PATENT NO. : 5,232,570
DATED : August 3, 1993
INVENTOR(S) : William G. Haines et al.

It is certified that error appears in the above-indentified patent and that said Letters Patent is hereby corrected as shown below:

Col. 1, line 22, before "Typically", insert --.--.

Col. 6, line 62, after "," insert a space.

Col. 8, line 23, after "generally", delete "lo".

Col. 11, line 58, before "angstroms", insert --25--.

Col. 8, line 47, after "substrate", delete the space before the period.

Col. 9, line 58, "Elementa" should be --Elemental--.

Col. 14, line 50, "claim 14" should be --claim 16--.

Signed and Sealed this

Thirteenth Day of June, 1995

Attest:

BRUCE LEHMAN

Attesting Officer   Commissioner of Patents and Trademarks